United States Patent [19]
Kim

[11] Patent Number: 5,366,931
[45] Date of Patent: Nov. 22, 1994

[54] FABRICATION METHOD FOR ON-CHIP DECOUPLING CAPACITOR

[75] Inventor: Hong S. Kim, Kyoungki, Rep. of Korea

[73] Assignee: Hyundai Electronics Industries, Co., Ltd., Kyoungki, Rep. of Korea

[21] Appl. No.: 967,893

[22] Filed: Oct. 28, 1992

[30] Foreign Application Priority Data

Oct. 30, 1991 [KR] Rep. of Korea ............... 91-19160

[51] Int. Cl.⁵ ............................................. H01L 21/60
[52] U.S. Cl. ................................... 437/209; 437/211; 437/214; 437/217; 437/220
[58] Field of Search ............... 437/209, 211, 214, 215, 437/216, 217, 220

[56] References Cited

U.S. PATENT DOCUMENTS

| | | | |
|---|---|---|---|
| 4,177,480 | 12/1979 | Hintzmann et al. | 437/217 |
| 4,410,905 | 10/1983 | Grabbe | 437/217 |
| 5,032,892 | 7/1991 | Chern et al. | |
| 5,081,067 | 1/1992 | Shimizu et al. | 437/216 |
| 5,148,265 | 9/1992 | Khandros et al. | 257/773 |
| 5,162,264 | 11/1992 | Haug et al. | 437/209 |
| 5,179,039 | 1/1993 | Ishida et al. | 437/211 |

Primary Examiner—Tom Thomas
Assistant Examiner—Kevin M. Picardat
Attorney, Agent, or Firm—Dykema Gossett

[57] ABSTRACT

This invention relates to a technology designed to fabricate the on-chip decoupling capacitor wherein both semiconductor chip and lead-frame are used as each electrode of capacitor and the source voltage is applied to the electrode, thus maximizing the capacity of decoupling capacitor.

5 Claims, 3 Drawing Sheets

FABRICATION METHOD FOR ON-CHIP DECOUPLING CAPACITOR

BACKGROUND OF THE INVENTION

1. Field of the Invention

This invention relates to a method for fabricating on-chip decoupling capacitor and more particularly to a method of this kind wherein both lead-frame and semiconductor chip can be used as each electrode of capacitor, thus maximizing the capacity of decoupling capacitor.

2. Description of the Prior Art

Generally, the decoupling capacitor is formed on the upper part of semiconductor chip by the process of MOS transistor in order to remove any noise generated within the chip. The noise value $\Delta V$ is given by $$\Delta V = \frac{C}{C_D + C} \cdot V_D \quad (1)$$

where $V_{DD}$ is the source voltage, v ms the noise voltage, C is a total capacitor in semiconductor chip, and $C_D$ is the on-chip decoupling capacitance. To minimize noise value V from above equation (1), the value of $C_D$ must be enlarged. The value of $C_D$ is given by $$C_D = \epsilon_o \cdot \epsilon_{ox} \cdot \frac{D_c^2}{H} \quad (2)$$

where $\epsilon_o$ is the dielectric constant in vacuum, $\epsilon_{ox}$ is the dielectric constant of dielectric, $D_c^2$ is the capacitor area, and H is the thickness of dielectric. To increase the value of $C_D$ from equation (2), $D_c^2$ must be enlarged. In the past, the on-chip decoupling capacitors were recognized to be disadvantageous in that their occupation on the upper part of semiconductor chip made their chip size larger, and there was no space sufficient enough to accommodate the capacitor with a large capacity.

SUMMARY OF THE INVENTION

The present invention, therefore, has as its principle object the provision of a novel fabrication method for on-chip decoupling capacitor which is free from the aforementioned defects by maximizing the capacity of decoupling capacitor, by the following proceeding steps; the back side of semiconductor chip is used as one electrode of decoupling capacitor, which is designed to enlarge the capacitor area (Dc²) while lead-frame itself, which is so constructed as to package the semiconductor chip, becomes the remaining electrode. The present invention is characterized by fabricating the on-chip decoupling capacitor where voltage is applied between semiconductor chip and lead-frame.

The more practical and important features of the present invention have been outlined above in order that the detailed description of the invention which follows will be better understood and that the present contribution to the art can be fully appreciated. Additional features of the invention described hereinafter also form the subject matter of the claims of the invention. Those skilled in the art can appreciate that the conceptions and the specific embodiments disclosed herein may be readily utilized as bases for modifying or designing other structures for carrying out the same purposes as those of the present invention. Further, those skilled in the art can realize that such modified or newly-designed other structures do not depart from the spirit and scope of the invention as set forth in the claims.

BRIEF DESCRIPTION OF THE DRAWINGS

For a fuller understanding of the nature and object of the invention, reference should be made to the following Detailed Description of the Invention in conjunction with the accompanying drawings, a brief description of which drawings follow.

Figure 1:
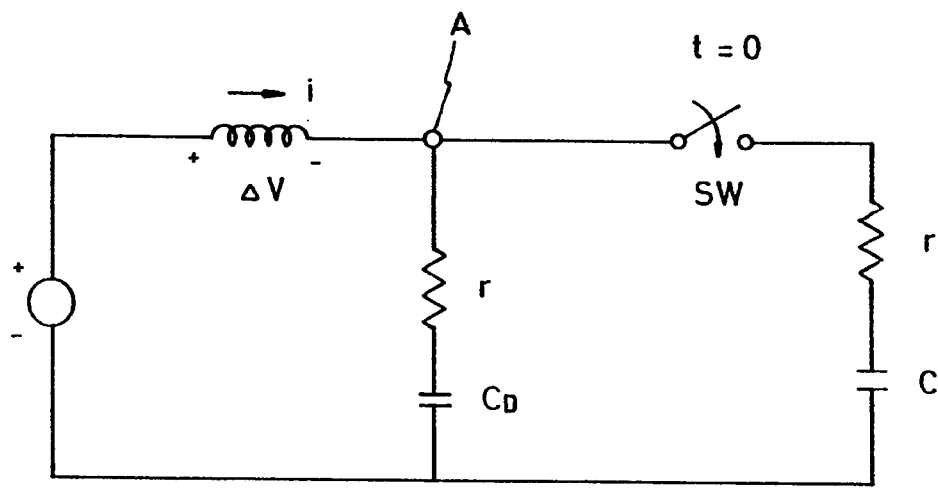
FIG. 1 is a schematic diagram illustrating an embodiment of RLC equivalent circuit in IC.

The respective reference numerals noted in the detailed description of the invention below refer to the respective reference numerals relating to the pertinent drawing parts and found as applicable throughout the several views of the drawings.

FIG. 1 shows a schematic diagram illustrating an embodiment of RLC equivalent circuit in integrated circuit (IC); When switch is on ($t=\phi$), $\Delta V$ is induced at both sides of inductor (L). Hence, the voltage an node A passing through the inductor (L) becomes Vcc− $\Delta V$ and after $t=\phi$, the electric charge $C_D$ (decoupling ca will be allocated to C (total capacity of Semiconductor chip). Therefore, it becomes $$C_D \cdot V_{DD} = (V_{DD} - \Delta V)(C_D + C)$$

$$V_{DD} - \Delta V = \frac{C_D \cdot V_{DD}}{C_D + C}$$

$$-\Delta V = \frac{C}{C_D + C} \cdot V_{DD}$$

If the capacity for C is 10nf and on-chip decoupling capacitor is 0.1 µf respectively, the value of $\Delta V$ is given by $$\Delta V = -\frac{10\ nf}{10\ nf + 0.1\mu f} \cdot V_{DD}$$
$$= -0.5\ V$$

The larger the capacity of on-chip decoupling capacitor becomes, the smaller the noise value of $\Delta V$ will be. Therefore, the decoupling capacity $C_C$ should be desirably enlarged. As mentioned previously, the $C_D$ value is $$C_D = \epsilon_o \cdot \epsilon_{ox} \cdot \frac{D_c^2}{H}$$

where $D_c^2$ is the capacitor area, H is the thickness of dielectric, and $\epsilon_{ox}$ is the dielectric constant of dielectric. Thus, to enlarge the value of $C_D$, $\epsilon_{ox}$ or $D_c^2$ must be large or H must be reduced. However, as H and ox are determined by the process, $D_c^2$ must have a larger value for enlarging the capacity of decoupling capacitor in semiconductor chip. Unlike the conventional method, the present invention is to form the capacitor at the back side of semiconductor chip without additional specific process steps, thereby having a larger value of $D_c^2$. The basic structure is illustrated in both FIG. 2 and 3; hence, dielectric may be selected whenever necessary and some adhesives may also be available as dielectric itself. Special care need not taken during the process, as may be induced in the following:

Precise process is unnecessary because the absolute value of decoupling capacitor has of little significance;

The capacitor is formed regardless of uniform thickness or shape of insulator (dielectric).

As stated in the above, if the capacity of on-chip decoupling capacitor is about 10 times as large as that of total capacitor in semiconductor chip, the noise value $\Delta V$ is within 10% of the incremental change $V_{DD}$. Thus, the on-chip decoupling capacitor whose capacity is about 10 times over total capacitor of the chip will improve the properties of alternating current in the chip.

Figure 2:
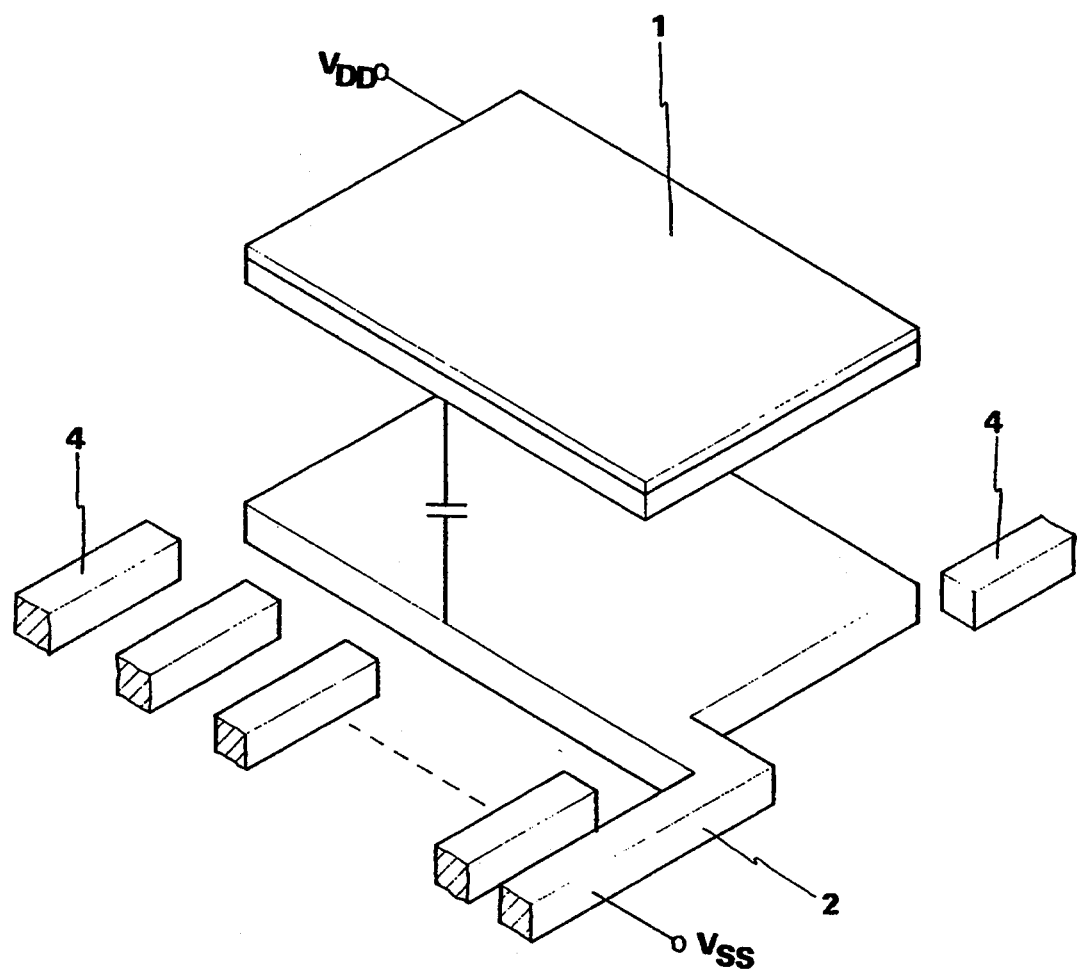
FIG. 2 and FIG. 3 are fabrication diagrams illustrating an embodiment of on-chip decoupling capacitor in accordance with the present invention.
Figure 3:
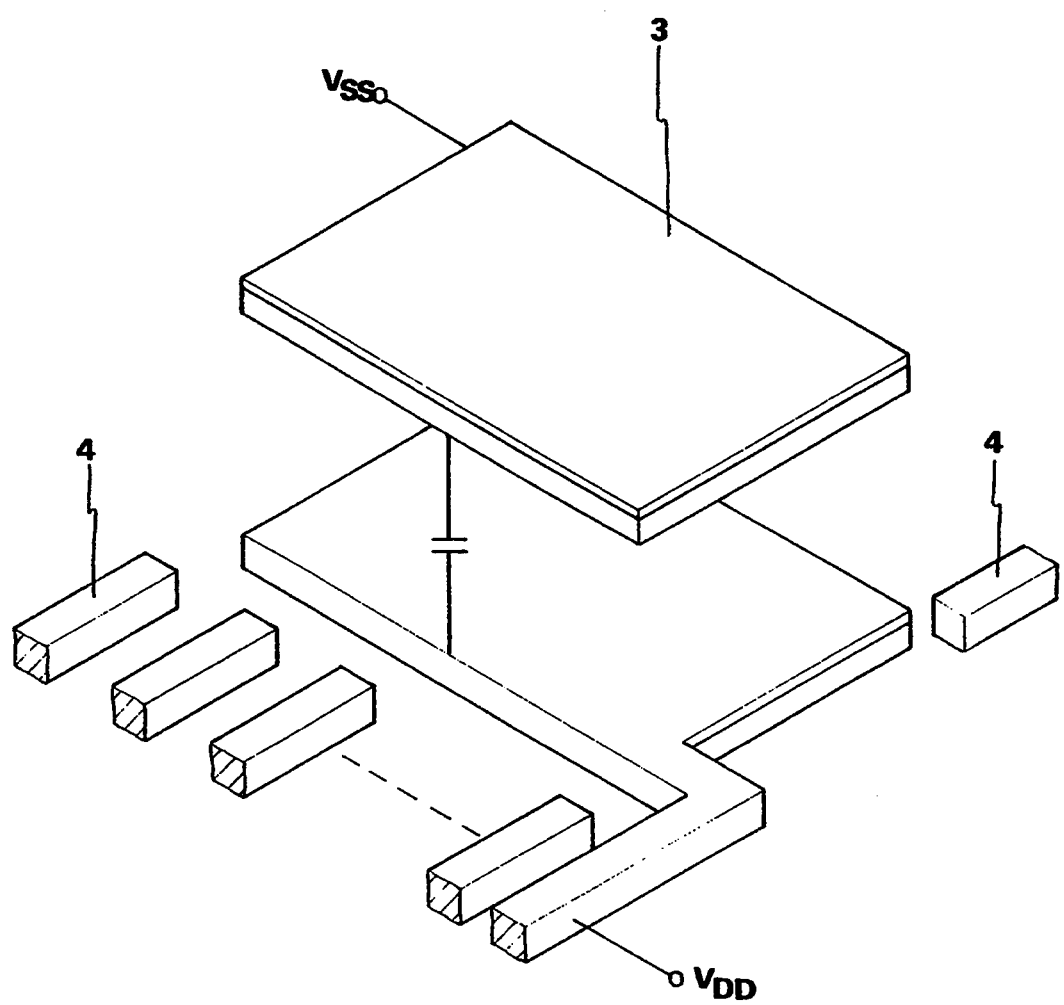

FIG. 2 shows the semiconductor chip using n-type plate, wherein n-type plate 1 is biased with positive voltage($V_{DD}$) and earth(Vss) is connected to lead-frame 2, thereby fabricating the on-chip decoupling capacitor; FIG. 3 shows the semiconductor chip using p-type plate, wherein p-type plate 3 is connected to grounded terminal Vss and lead-frame 2 is biased with positive voltage $V_{DD}$, thereby fabricating the on-chip decoupling capacitor.

In the case of applying $V_{BB}$ (negative back bias) to p-type plate as done in DRAM, the lead-frame 2 is biased with $V_{DD}$ or $V_{SS}$ to increase $V_{BB}$ capacitor, and the change of $V_{BB}$ may be reduced in proportion to the change of $V_{DD}$ or indirectly, the capacitor between Vss and $V_{DD}$ may be increased. According to the present invention, semiconductor chip is used as one electrode and lead-frame as the other so that the desired capacitor will be made available by selecting dielectric whenever necessary and by placing it on the lead-frame for the sake of chip's bonding and packaging. To this end, if necessary, the dielectric having a high dielectric constant may be used. Alternatively, in case that non-conductive bonding materials are adhered to semiconductor chip instead of some dielectrics, any additional processing steps are not required. As stated above, according to the present invention, the back side of semiconductor chip regardless of its kind is used so as to form the on-chip decoupling capacitor whose capacity is about 10 times as large as that of total capacitor in semiconductor chip and the noise value $\Delta V$ against the change of $V_{DD}$ is limited to be within 10%, thus improving the properties of alternating current in all kinds of ICs. Also, if a dielectric is used for bonding material, the capacity of capacitor may be adjusted whenever necessary and if a semiconductor chip is bonded using the tape-automated bonding(TAB) technique, the on-chip decoupling capacitor can be easily formed.

Although this invention has been described in its preferred forms with a certain degree of particularity, it will be appreciated by those skilled in the art that the present disclosure of the preferred forms has been effected only by way of example, and that numerous changes in the details of the construction, combination and arrangement of parts may be resorted to without departing from the spirit and scope of the invention.

I claim:

1. A method for fabricating a decoupling capacitor in semiconductor IC, comprising the steps of:
    using a back side of the semiconductor chip as one electrode of the decoupling capacitor, which is designed to enlarge the capacitor area; and
    using a lead-frame as the remaining electrode of the decoupling capacitor, said lead-frame being so constructed as to package the semiconductor chip,
    wherein the voltage is applied between the semiconductor chip and lead-frame, and said chip and lead-frame are used as each electrode of the capacitor.

2. The method of claim 1, wherein a dielectric is inserted between the semiconductor chip and the lead-frame.

3. The method of claim 1, wherein an N-type plate is used as the semiconductor chip and is biased with positive voltage and the lead-frame is in a grounded state.

4. The method of claim 1, wherein the lead-frame is biased with a positive voltage and the semiconductor chip is in a grounded state.

5. The method of claim 4, wherein the semiconductor chip is biased with a negative back biased voltage and the lead-frame is biased with a voltage from the set consisting of positive voltage or grounded voltage.

* * * * *